(12) United States Patent
Kim et al.

(10) Patent No.: US 7,944,759 B2
(45) Date of Patent: May 17, 2011

(54) SEMICONDUCTOR MEMORY DEVICE INCLUDING FLOATING BODY TRANSISTOR

(75) Inventors: Jin-Young Kim, Seoul (KR); Ki-Whan Song, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 219 days.

(21) Appl. No.: 12/285,520

(22) Filed: Oct. 8, 2008

(65) Prior Publication Data

US 2009/0097332 A1    Apr. 16, 2009

(30) Foreign Application Priority Data

Oct. 10, 2007    (KR) .................. 10-2007-0102005

(51) Int. Cl.
*G11C 16/04*    (2006.01)
(52) U.S. Cl. .......... 365/189.07; 365/185.22; 365/185.17
(58) Field of Classification Search ............. 365/189.07, 365/211, 185.22, 185.17
See application file for complete search history.

(56) References Cited

U.S. PATENT DOCUMENTS

| | | | |
|---|---|---|---|
| 5,146,152 A | 9/1992 | Jin et al. | |
| 5,953,263 A | 9/1999 | Farmwald et al. | |
| 5,998,840 A | 12/1999 | Kim | |
| 6,055,183 A | 4/2000 | Ho et al. | |
| 6,060,750 A | 5/2000 | Hisamoto et al. | |
| 6,084,812 A * | 7/2000 | Joo | 365/222 |
| 6,147,903 A | 11/2000 | Takahashi | |
| 6,475,890 B1 | 11/2002 | Yu | |
| 6,567,330 B2 | 5/2003 | Fujita et al. | |
| 6,621,725 B2 | 9/2003 | Ohsawa | |
| 6,697,909 B1 | 2/2004 | Wang et al. | |
| 6,723,638 B1 | 4/2004 | He et al. | |
| 6,826,074 B2 * | 11/2004 | Yamauchi | 365/154 |
| 6,861,689 B2 | 3/2005 | Burnett | |
| 6,882,008 B1 | 4/2005 | Ohsawa | |
| 6,982,918 B2 | 1/2006 | Fazan et al. | |
| 7,064,973 B2 | 6/2006 | Peng et al. | |

(Continued)

FOREIGN PATENT DOCUMENTS

JP    04-366492    12/1992

(Continued)

OTHER PUBLICATIONS

K. Ota et al., "Novel Locally Strained Channel Technique for High performance 55nm CMOS", *IEEE*, pp. 27-30 (2002).

(Continued)

*Primary Examiner* — Connie C Yoha
(74) *Attorney, Agent, or Firm* — Harness, Dickey & Pierce, P.L.C.

(57) ABSTRACT

A semiconductor memory device includes a memory cell array including a plurality of memory cells having a transistor with a floating body, a source line driver configured to control the source lines to select the memory cells in response to an address signal, a source line voltage generation unit configured to generate a source line target voltage, receive an source line output voltage from the source line driver, compare the level of the source line output voltage with the level of the source line target voltage, generate a source line voltage of which the level is adaptively varied according to a temperature, and a sense amplifier configured to sense a difference in current flowing through the bit lines in response to data read from a selected memory cell, amplify the difference to a level having high output driving capability and output the amplified current.

25 Claims, 8 Drawing Sheets

U.S. PATENT DOCUMENTS

| | | | |
|---|---|---|---|
| 7,075,151 B2 | 7/2006 | Shino | |
| 7,098,507 B2 | 8/2006 | Tang et al. | |
| 7,154,788 B2 | 12/2006 | Takemura et al. | |
| 7,170,807 B2 | 1/2007 | Fazan et al. | |
| 7,187,581 B2 | 3/2007 | Ferrant et al. | |
| 7,233,536 B2 | 6/2007 | Ogiwara et al. | |
| 7,301,803 B2* | 11/2007 | Okhonin et al. | 365/177 |
| 7,326,634 B2 | 2/2008 | Lindert et al. | |
| 7,436,724 B2* | 10/2008 | Nandi | 365/211 |
| 2002/0057622 A1 | 5/2002 | Sim | |
| 2003/0231524 A1 | 12/2003 | Ohsawa | |
| 2004/0256683 A1 | 12/2004 | Lee et al. | |
| 2005/0026354 A1 | 2/2005 | Bhattacharyya | |
| 2005/0068807 A1 | 3/2005 | Ohsawa | |
| 2005/0180214 A1* | 8/2005 | Park | 365/185.18 |
| 2006/0081851 A1 | 4/2006 | Ono | |
| 2006/0092739 A1 | 5/2006 | Fujita et al. | |
| 2006/0131650 A1 | 6/2006 | Okhonin et al. | |
| 2006/0138558 A1 | 6/2006 | Morikado | |
| 2006/0208301 A1 | 9/2006 | Shino | |
| 2007/0007574 A1 | 1/2007 | Ohsawa | |
| 2007/0013007 A1 | 1/2007 | Kusunoki et al. | |
| 2007/0023809 A1 | 2/2007 | Villaret et al. | |
| 2007/0058427 A1 | 3/2007 | Okhonin et al. | |
| 2007/0090443 A1 | 4/2007 | Choi et al. | |
| 2007/0091703 A1 | 4/2007 | Nishimura et al. | |
| 2007/0097751 A1 | 5/2007 | Popoff et al. | |
| 2007/0158727 A1 | 7/2007 | Song et al. | |
| 2007/0285982 A1 | 12/2007 | Carman | |
| 2008/0130376 A1 | 6/2008 | Park et al. | |
| 2008/0278473 A1* | 11/2008 | An | 345/214 |
| 2008/0284493 A1* | 11/2008 | Baek et al. | 327/513 |
| 2008/0303095 A1 | 12/2008 | Xiong et al. | |

FOREIGN PATENT DOCUMENTS

| | | |
|---|---|---|
| JP | 2003-31696 | 1/2003 |
| JP | 2003-068877 | 3/2003 |
| JP | 2003-132682 | 5/2003 |
| JP | 2006-085812 | 3/2006 |
| JP | 2006/107560 | 4/2006 |
| JP | 2006-108396 | 4/2006 |
| JP | 2006-156986 | 6/2006 |
| JP | 2006-179746 | 7/2006 |
| JP | 2006-260722 | 9/2006 |
| JP | 2007-018588 | 1/2007 |
| JP | 2007-036257 | 2/2007 |
| JP | 2007-073680 | 3/2007 |
| KR | 10-1994-0003406 | 2/1994 |
| KR | 10-0248507 | 12/1999 |
| KR | 10-0429868 | 4/2004 |
| KR | 10-2005-0071665 | 7/2005 |
| KR | 10-0502374 | 7/2005 |
| KR | 10-0542161 | 1/2006 |
| KR | 10-0660910 | 12/2006 |
| KR | 10-0663359 | 12/2006 |
| KR | 10-0673012 | 1/2007 |
| KR | 10-0682537 | 2/2007 |
| KR | 10-0699890 | 3/2007 |
| KR | 10-2008-0047105 | 5/2008 |
| KR | 10-2008-0058806 | 6/2008 |

OTHER PUBLICATIONS

Takashi Ohsawa et al., "Memory Design Using a One-Transistor Gain Cell on SOI", *IEEE J .Solid State Circuits*, vol. 37, No. 11, pp. 1510-1522 (Nov. 2002).

"Bipolar Junction Transistor", *Wikipedia*, (http://en.wikipedia.orq/wiki/Bit) (May 19, 2008).

Matloubian et al., "Modeling of the Subthreshold Characteristics of SOI MOSFET's with Floating Body," *IEEE Trans. On Elec. Devices*, vol. 17, No. 9, pp. 1984-1994 (Sep. 1990).

Takashi Ohsawa et al., "An 18.5ns 128Mb SOI DRAM with a Floating Body Cell", *ISSCC 2005*, Session 25, pp. 458-459, 609 (2005).

Chang Woo Oh et al., "Floating Body DRAM Characteristics of Silicon-on-ONO (SOONO) Devices for System-on-Chip (SoC) Applications", *2007 Symp.on VLSI Tech. Digest of Tech. Papers.*, pp. 168-169 (2007).

"Capacitor-less IT DRAM cell structure for sensing margin and retention time enhancement", *2007 The Korean Conference on Semiconductors*, (2007).

Hoon Jeong et al., "A Capacitor-less IT DRAM Cell Based on a Surrounding Gate MOSFET with a Vertical Channel", *2005 IEEE Silicon Nanoelectronics Workshop*, pp. 92-93 (2005).

Takashi Ohsawa et al., "A Memory Using One-Transistor Gain Cell on SOI(FBC) with Performance Suitable for Embedded DRAM's", *2003 Symp. On VLSI Circuits Digest of Technical Papers*, pp. 93-96 (2003).

Changhyun Cho et al., "A 6F$^2$ DRAM Technology in 60nm era for Gigabit Densities", *2005 Symp. On VLSI Technology Digest of Technical Papers*, pp. 36-37 (2005).

Office Action dated Jun. 7, 2010 for related U.S. Appl. No. 12/348,036.

Michel Bron et al., "A 2ns Read Latency, 4MB Embedded Z-Ram Floating Body Memory Macro in 45nm SOI Technology," Submission ID: 246.

Ki-Whan Song et al., "55nm Capacitor-less IT DRAM Cell Transistor with Non-Overlap Structure," Research and Development Center, Samsung Electronics Co., Gyeonggi, Korea.

Office Action dated Apr. 6, 2010 for related U.S. Appl. No. 12/171,406.

Office Action dated Oct. 27, 2010 for related U.S. Appl. No. 12/171,406.

U.S. Office Action dated Jan. 3, 2011 for U.S. Appl. No. 12/453,036.

* cited by examiner

SEMICONDUCTOR MEMORY DEVICE INCLUDING FLOATING BODY TRANSISTOR

PRIORITY STATEMENT

This application claims priority under 35 U.S.C. §119 to Korean Patent Application No. 2007-102005, filed on Oct. 10, 2007, in the Korean Intellectual Property Office (KIPO), the entire contents of which are hereby incorporated herein by reference.

BACKGROUND

1. Field

Example embodiments relate to a semiconductor memory device, for example, a semiconductor memory device including a memory array having a floating body transistor using operation of a bipolar junction transistor.

2. Description of Related Art

A layout area of a semiconductor memory device may be reduced using a transistor having a floating body (hereinafter, a floating body transistor). The floating body transistor stores majority carriers in the floating body. However, since the stored majority carriers are lost in a known amount of time, the floating body transistor requires refreshing.

A memory cell array including a dynamic memory cell has been developed that has a floating body transistor using the operation of a bipolar junction transistor to improve an operating speed and a data retention characteristic.

Figure 1:
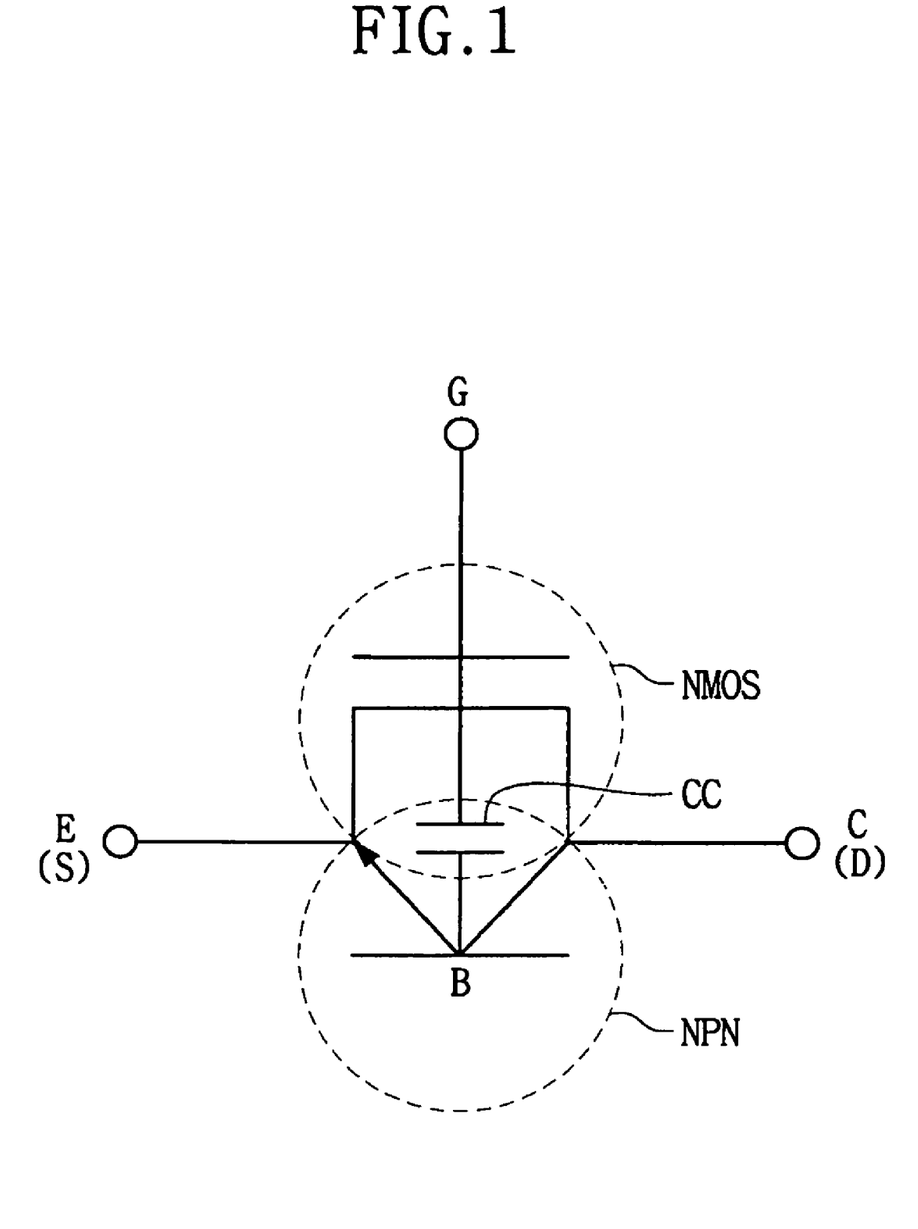
FIG. 1 is an example circuit diagram of a floating body transistor.

FIG. 1 is an example circuit diagram of a floating body transistor.

Referring to FIG. 1, the floating body transistor includes an NMOS field effect transistor (hereinafter, referred to as 'NMOS transistor') NMOS and an NPN bipolar junction transistor (hereinafter, referred to as 'NPN transistor') NPN. A source S of the NMOS transistor NMOS also functions as an emitter E of the NPN transistor NPN, a drain D of the NMOS transistor NMOS also functions as a collector C of the NPN transistor NPN, and a base B of the NPN transistor NPN is electrically floating. Also, a coupling capacitor CC is located between a gate G of the NMOS transistor NMOS and the base B of the NPN transistor NPN.

Data "1" refers to a state where majority carriers (holes, for example) are accumulated in a floating body region, while the data "0" refers to a state where minority carriers (electrons, for example) are accumulated in the floating body region.

When a gate voltage Vg is 0V, current rapidly rises before a drain-source voltage Vds reaches a known voltage level, irrespective of whether the floating body transistor is in a data "1" state or a data "0" state. Thereafter, when the drain-source voltage Vds reaches the known voltage level or higher, holes are initially injected into the base B of the NPN transistor NPN due to drain coupling so that an electrical potential of the base B increases. As a result, a forward voltage is applied between the base B and the emitter E causing an emitter current to flow. The emitter current is supplied to the collector C, and the passage of emitter current through a band-bending region between the base B and the collector C causes band-to-band tunneling and/or impact ionization.

Due to the band-to-band tunneling and/or impact ionization, holes are injected from the collector C to the base B and the electrical potential of the base B further increases. As a result, the drain-source voltage Vds increases, so that when the NPN transistor NPN is turned on, a bipolar current Ids rapidly rises due to a feed forward system of the NPN transistor NPN. Impact ionization causes a multiplication factor to increase, resulting in a further rise in bipolar current Ids.

The data "1" state is written due to the bipolar current Ids. When the floating body transistor is in the data "1" state, the NPN transistor NPN is turned on at a lower drain-source voltage Vds as compared with the case of the data "0" state, thereby increasing the bipolar current Ids. This is because band-to-band tunneling and/or impact ionization causes a higher number of holes to accumulate in the floating body resulting in a higher electric potential of the floating body and the NPN transistor NPN can be quickly turned on, compared to when the floating body transistor is in the data "0" state.

When the gate voltage Vg is negative, the bipolar current Ids rapidly increases at a relatively high drain-source voltage Vds as compared to the case where the gate voltage Vg is 0V. As the gate voltage Vg decreases, an electrostatic potential of the base B decreases. Therefore, it is necessary to increase the drain-source voltage Vds to turn on the NPN transistor NPN due to band-to-band tunneling and/or impact ionization.

SUMMARY

According to example embodiments, a semiconductor memory device may comprise a memory cell array including a plurality of memory cells connected to a plurality of word lines, source lines, and bit lines, each memory cell having a transistor with a floating body, a source line driver configured to control at least one of a plurality of source lines to select at least one memory cell of a plurality of memory cells in response to an address signal, a source line voltage generation unit configured to receive a source line reference voltage to generate a source line target voltage, receive a source line output voltage from the driver, compare the level of the source line output voltage with the level of the source line target voltage, adaptively vary the source line output voltage according to a temperature, and supply the source line output voltage to the at least one source line and a sense amplifier configured to sense a difference in current flowing through the plurality of bit lines in response to a data read from the selected at least one memory cell, amplify the difference to a level having high output driving capability and output the amplified current.

The semiconductor memory device, according to example embodiments, may further comprise a column controller configured to control the plurality of bit lines to select the at least one memory cell in response to a write signal or a read signal and the address signal and a word line driver configured to control the plurality of word lines to select the at least one memory cell in response to the write signal or the read signal and the address signal.

According to example embodiments, the memory cell array may control the flow of a bipolar current through the memory cells selected by one of the word lines, source lines and the bit lines to write or read data "1" or data "0".

The column controller, according to example embodiments, may control the plurality of bit lines in response to the write signal or the read signal and the address signal to prevent data from being written to or read from unselected memory cells and to write/read the data "1" or the data "0" to/from the selected memory cells.

The source line voltage generation unit, according to example embodiments, may include a plurality of source line voltage generators, each of the source line voltage generators adaptively varying the source line output voltage to generate an source line output voltage that is intermediate between a drain-source voltage for putting the transistor into a data "1" state and a drain-source voltage for putting the transistor into a data "0" state when an ambient temperature of the semiconductor memory device is changed.

Each of the source line voltage generators, according to example embodiments, may include a source line target voltage generator configured to receive the source line reference voltage and a gate voltage and generate the source line target voltage, a comparator configured to receive the source line target voltage and the source line output voltage, compare the source line target voltage with the source line output voltage, and output a variable voltage signal, a power current supply configured to receive a power supply voltage, control the amount of supply current in response to the variable voltage signal and output the controlled supply current and a charge pump configured to receive the supply current from the power current supply, increase the source line output voltage to a level of the source line target voltage when the source line output voltage is at a level lower than the generated source line target voltage and supply the increased source line output voltage to the source line driver and the comparator.

The source line target voltage generator, according to example embodiments, may include a resistor having a first terminal supplied with the source line reference voltage and a reference memory cell having a drain terminal connected to a second terminal of the resistor and supplied with the source line reference voltage, a grounded source terminal and a gate terminal to which the gate voltage is applied, the reference memory cell generating the source line target voltage at the drain terminal.

According to example embodiments, the resistor of the source line target voltage generator may include a PMOS or an NMOS transistor and the reference memory cell and the at least one memory cell of the memory cell array may be produced using the same semiconductor memory fabrication process, the reference memory cell having substantially similar temperature characteristics as the at least one memory cell.

According to example embodiments, the comparator may receive the generated source line target voltage at a negative terminal, a fed back source line output voltage at a positive terminal, compare the source line target voltage with the source line output voltage and output a variable voltage signal, wherein the voltage level of the variable voltage signal is decreased when the source line target voltage is higher than the source line output voltage and is increased when the source line target voltage is lower than the source line output voltage.

According to example embodiments, the power current supply may include a PMOS transistor, which may receive the power supply voltage at a source terminal and the variable voltage signal at a gate terminal, and may be turned on when a decreased variable voltage signal is received, supplying an increased amount of supply current and may be turned off when an increased variable voltage signal is received, supplying a reduced amount of supply current.

According to example embodiments, the charge pump may include a grounded capacitor receiving an increased amount of supply current when the generated source line target voltage is higher than the source line output voltage, thereby increasing the source line output voltage to the level of the source line target voltage.

According to example embodiments, the sense amplifier may sense a difference between a drain-source current for putting the transistor into the data "1" state and a drain-source current for putting the transistor into the data "0" state in response to data written to the selected at least one memory cell, amplify the difference to a level having high output driving capability and output the amplified current.

According to other example embodiments, a semiconductor memory device may comprise a memory cell array including a plurality of memory cells connected to a plurality of word lines, source lines and bit lines, each memory cell having a transistor with a floating body, a bit line driver configured to control the plurality of bit lines to select at least one memory cell of the plurality of memory cells in response to an address signal, a bit line voltage generation unit configured to receive a bit line reference voltage to generate a bit line target voltage, receive a bit line output voltage from the bit line driver, compare the level of the bit line output voltage with the level of the bit line target voltage, adaptively vary the bit line output voltage according to the temperature and supply the bit line output voltage to the plurality of bit lines and a sense amplifier configured to sense a difference in current flowing through the plurality of bit lines in response to data read from the selected at least one memory cell, amplify the difference to a level having high output driving capability and output the amplified current.

The semiconductor memory device, according to other example embodiments, may further comprise a row controller configured to control the plurality of word lines and the source lines to select the at least one memory cell in response to a write signal or a read signal and the address signal.

The memory cell array, according to other example embodiments, may control the flow of a bipolar current through the at least one memory cell selected by at least one of the plurality of word lines, source lines and bit lines to write or read data "1" or data "0."

The bit line voltage generation unit may include a plurality of bit line voltage generators, each of the bit line voltage generators adaptively varying the bit line output voltage to generate a bit line output voltage that is an intermediate between a drain-source voltage for putting the transistor into a data "1" state and a drain-source voltage for putting the transistor into a data "0" state when an ambient temperature of the semiconductor memory device is changed.

Each of the bit line voltage generators may include a bit line target voltage generator configured to receive the bit line reference voltage and a gate voltage and generate the bit line target voltage, a comparator configured to receive the bit line target voltage and the bit line output voltage, compare the bit line target voltage with the bit line output voltage and output a variable voltage signal, a power current supply configured to receive a power supply voltage, control the amount of supply current in response to the variable voltage signal, and output the controlled supply current, and a charge pump configured to receive the supply current from the power current supply, increase the bit line output voltage to a level of the bit line target voltage when the bit line output voltage is at a level lower than the generated bit line target voltage and supply the increased bit line output voltage to the bit line driver and the comparator.

The bit line target voltage generator may include a resistor having a first terminal supplied with the bit line reference voltage and a reference memory cell having a drain terminal connected to a second terminal of the resistor and supplied with the bit line reference voltage, a grounded source terminal and a gate terminal to which the gate voltage may be applied, the reference memory cell generating the bit line target voltage at the drain terminal.

According to other example embodiments, the resistor of the bit line target voltage generator may include a PMOS or an NMOS transistor, and the reference memory cell and the at least one memory cell of the memory cell array may be produced using the same semiconductor memory fabrication process, the reference memory cell having substantially similar temperature characteristics as the at least one memory cell.

According to other example embodiments, the comparator may receive the generated bit line target voltage at a negative terminal, receive a fed back bit line output voltage at a positive terminal, compare the bit line target voltage with the bit line output voltage and may output a variable voltage signal, wherein the voltage level of the variable voltage signal may be decreased when the bit line target voltage is higher than the bit line output voltage and may be increased when the bit line target voltage is lower that the bit line output voltage.

According to other example embodiments, the power current supply may include a PMOS transistor, which may receive the power supply voltage at a source terminal and the variable voltage signal at a gate terminal, and may be turned on when a decreased variable voltage signal is received, supplying an increased amount of supply current and may be turned off when an increased variable voltage is received, supplying a reduced amount of supply current.

According to other example embodiments, the charge pump may include a grounded capacitor receiving an increased amount of supply current when the generated bit line target voltage is higher than the bit line output voltage, thereby increasing the bit line output voltage to the level of the bit line target voltage.

According to other example embodiments, the sense amplifier may sense a difference between a drain-source current for putting the transistor into the data "1" state and a drain-source current for putting the transistor into the data "0" state in response to data written to the selected at least memory cell, may amplify the difference to a level having high output driving capability and may output the amplified current.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
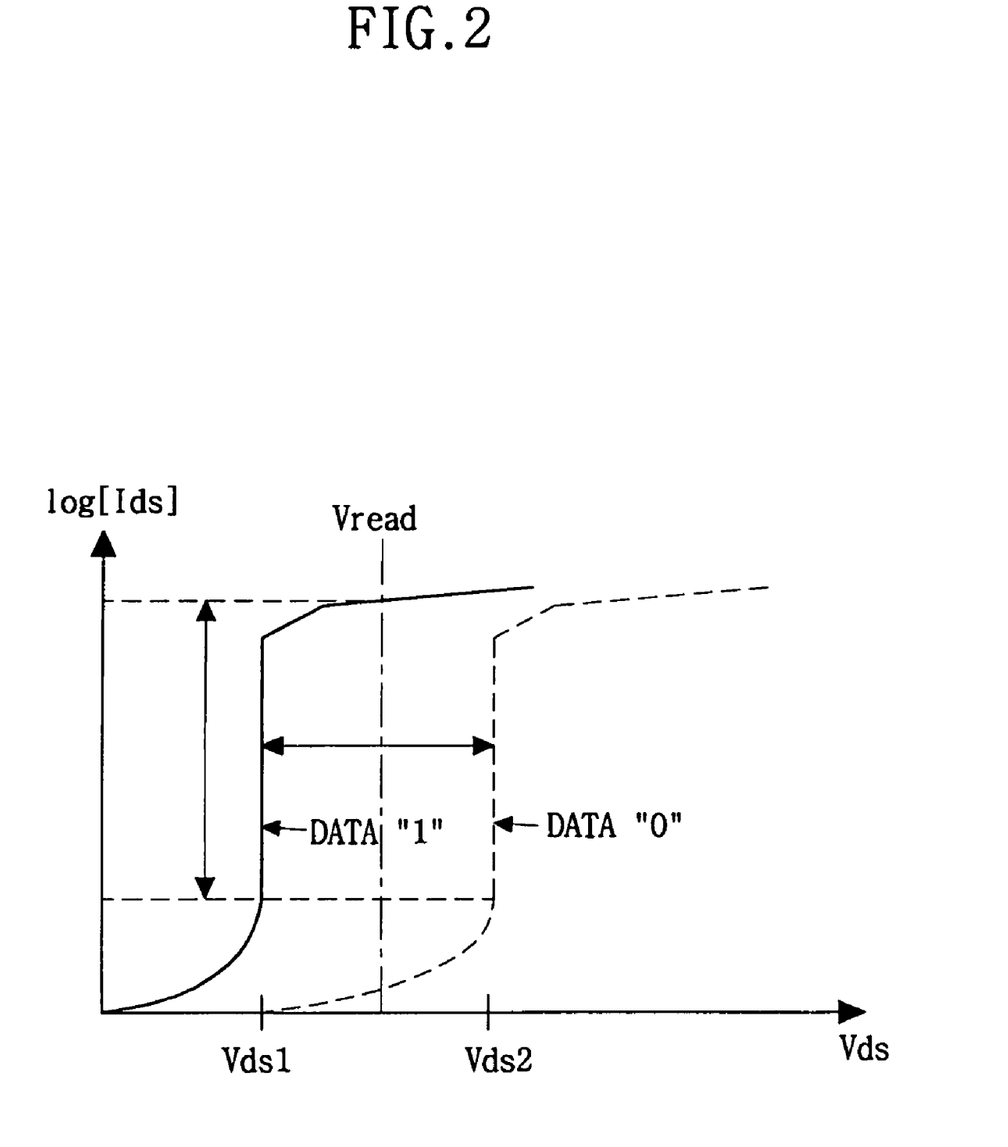
FIG. 2 is a voltage-current (VI) curve showing a permitted range of a data read voltage in a 1-transistor dynamic random access memory (1T-DRAM) using operation of a bipolar junction transistor.

FIG. 2 is a voltage-current (VI) curve showing a permissible range of a data read voltage in a 1-transistor dynamic random access memory (1T-DRAM) using operation of a bipolar junction transistor. An abscissa may denote a drain-source voltage Vds and an ordinate may denote a log value of a drain-source current Ids. A solid line may denote a VI curve for putting a transistor into a data "1" state, and a dotted line may denote a VI curve for putting the transistor into a data "0" state.

Referring to the solid line VI curve, it may be seen that an initial increase in a drain-source voltage Vds may result in gradual increase in a drain-source current Ids. However, when the drain-source voltage Vds reaches a first drain-source voltage level Vds1, the drain-source current Ids may rise sharply. Referring to the dotted line VI curve, it may be seen that an initial increase in the drain-source voltage Vds may result in a gradual increase in the drain-source current Ids. However, when the drain-source voltage Vds reaches a second drain-source voltage level Vds2, the drain-source current Ids may rise sharply.

In order for a sense amplifier to reliably sense a difference in the drain-source current Ids, a data read voltage Vread may be used as an intermediate value between a drain-source voltage Vds1 required for the data "1" state and a drain-source voltage Vds2 required for the data "0" state. Data read voltage Vread may be required to be higher than an offset voltage corresponding to the minimum difference in the drain-source current Ids which the sense amplifier may reliably sense.

In other words, a lower one of a difference in voltage level between the data read voltage Vread and the drain-source voltage Vds1 required for the data "1" state and a difference in voltage level between the data read voltage Vread and the drain-source voltage Vds2 required for the data "0" state must be higher than the offset voltage of the sense amplifier.

However, as stated above, a source-line voltage control method of a floating body transistor using operation of a bipolar junction transistor is susceptible to a temperature variation because a direct-current (DC) characteristic varies with the temperature, as will now be described in more detail.

Figure 3A:
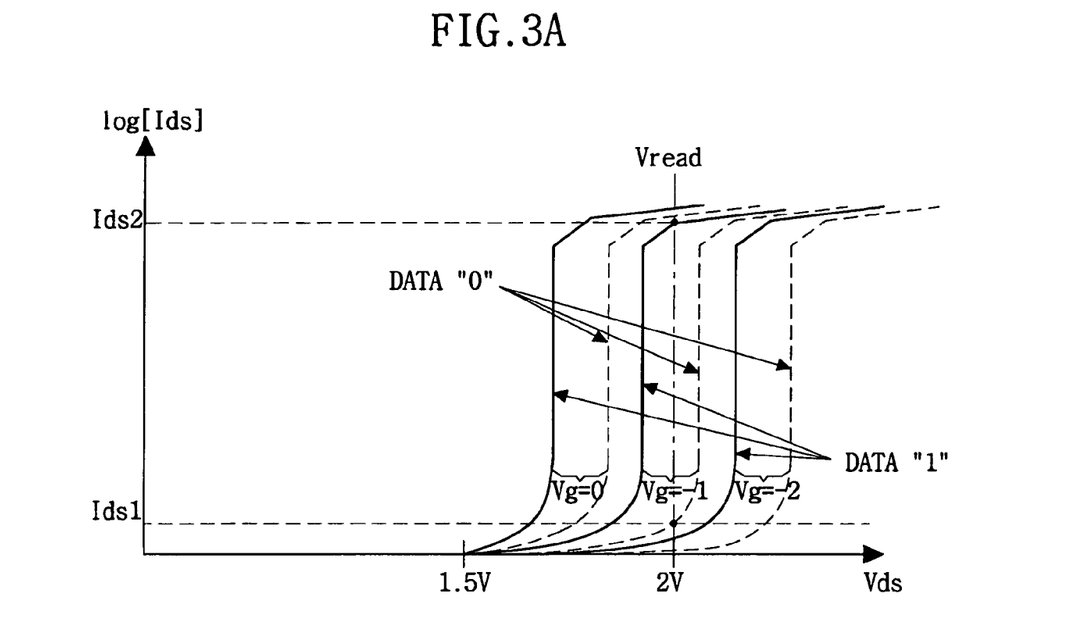
FIGS. 3A through 3C are VI curves showing DC characteristics with respect to an ambient temperature of the floating body transistor of FIG. 1.
Figure 3B:
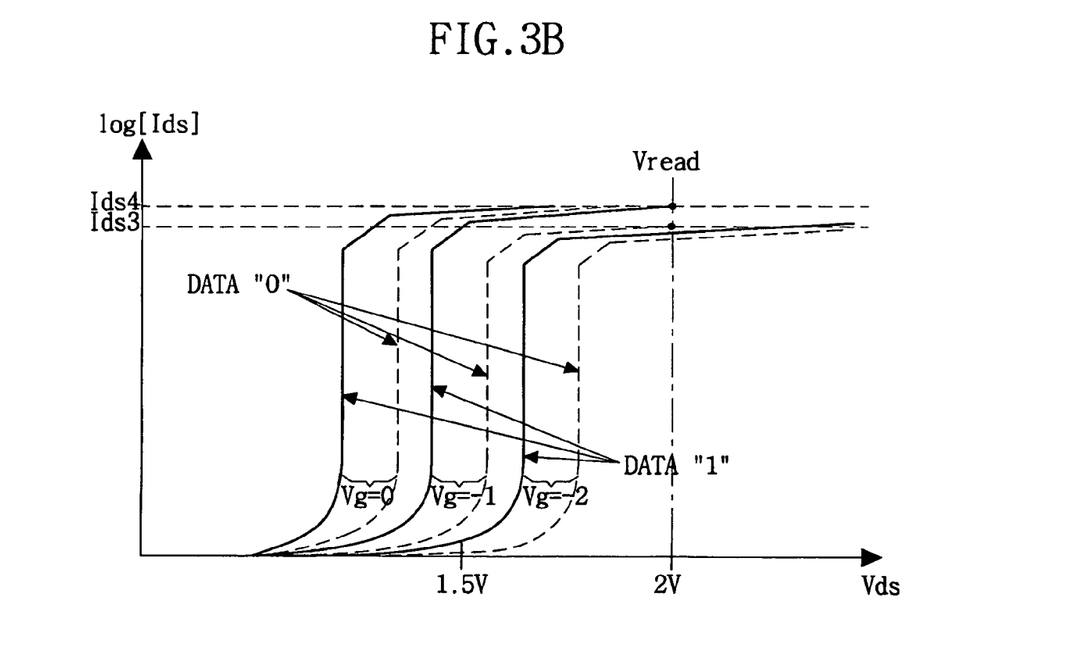
Figure 3C:
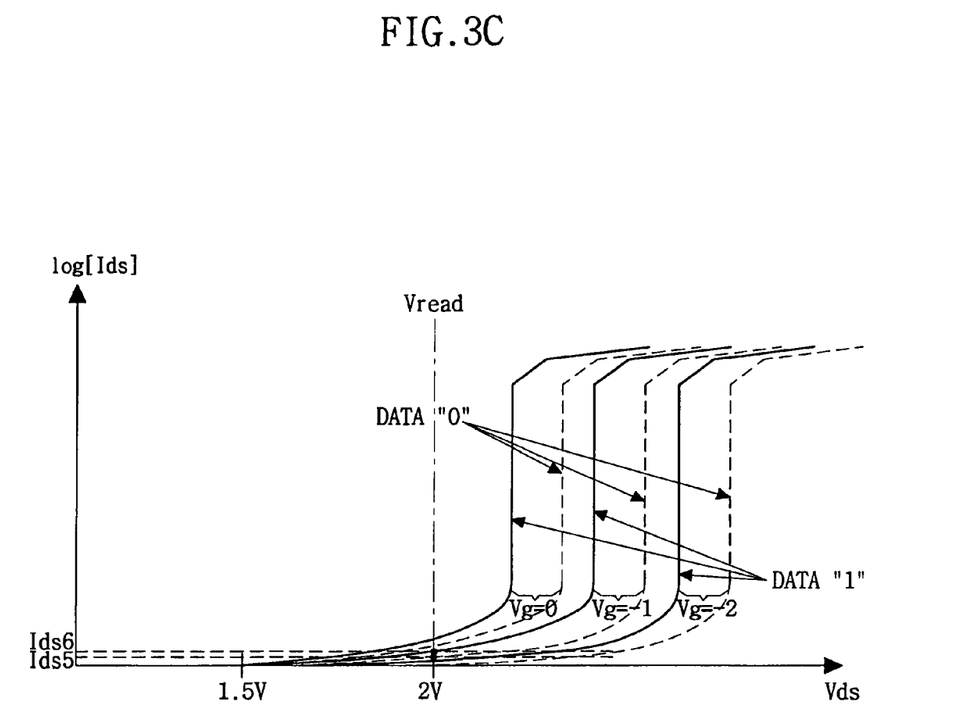

FIGS. 3A through 3C are VI curves showing DC characteristics with respect to temperature of the floating body transistor shown in FIG. 1. FIG. 3A shows a DC characteristic at a temperature of about 25° C., FIG. 3B shows a DC characteristic at a temperature of about 85° C., and FIG. 3C shows a DC characteristic at a temperature of about −20° C.

In FIGS. 3A through 3C, an abscissa may denote a drain-source voltage Vds, and an ordinate may denote a log value of a drain-source current Ids. A solid line may denote a VI curve for putting the floating body transistor into a data "1" state, and a dotted line may denote a VI curve for putting the floating body transistor into a data "0" state.

Each of FIGS. 3A through 3C show a VI curve of a drain-source voltage Ids relative to a drain-source voltage Vds of the transistor in the data "1" state and the data "0" state for a gate voltage Vg of 0V, −1V, and −2V. Referring to FIG. 3B, as the drain-source voltage Vds increases, the drain-source current Ids gradually increases. As can be seen, due to a temperature characteristic of the transistor in FIG. 3B the drain-source voltage Vds where the drain-source current Ids rapidly rises is lower in FIG. 3B than in FIG. 3A. As a result, VI curves shown in FIG. 3B are generally shifted to the left than VI curves shown in FIG. 3A. Referring to FIG. 3C, as the drain-source voltage Vds increases, the drain-source current Ids may gradually increase. As can be seen, due to the temperature characteristic of the transistor in FIG. 3C the drain-source voltage Vds where the drain-source current Ids rapidly rises is higher in FIG. 3C than in FIG. 3A. Accordingly, VI curves shown in FIG. 3C are generally shifted to the right than the VI curves shown in FIG. 3A.

That is, assuming that in FIG. 3A a gate voltage Vg is −1V, a data read voltage is 2V and the temperature is about 25° C., a log value of the drain-source current Ids for putting the transistor into the data "0" state is a first drain-source current Ids1 and a log value of the drain-source current Ids for putting the transistor into the data "1" state is a second drain-source current Ids2. Accordingly, the difference between the first and second drain-source currents Ids1 and Ids2 is sufficiently large such that the sense amplifier may reliably sense a difference in the currents Ids1 and Ids2.

However, when the temperature is raised to 85° C. as in FIG. 3B, the DC characteristic of the floating body transistor at a fixed data read voltage Vread of 2V is changed. Thus, there is a drop in the drain-source voltage Vds where the drain-source current Ids rapidly rises. As a result, log values of the drain-source current Ids4 for putting the transistor into the data "1" state and of the drain-source current Ids3 for putting the transistor into the data "0" state may greatly rise and may be about equal to each other.

Conversely, when the temperature is dropped to −20° C. as in FIG. 3C, the DC characteristic of the floating body transistor at a fixed data read voltage Vread of 2V may be changed. Thus, the drain-source voltage Vds where the drain-source current Ids rapidly rises may also rise. As a result, log values of the drain-source current Ids5 for putting the transistor into the data "0" state and of the drain-source current Ids6 for putting the transistor into the data "1" state may greatly drop and may be about equal to each other.

Accordingly, when a semiconductor memory device suffers from a sudden temperature variation, for example, when a temperature around the semiconductor memory device is raised to about 85° C. or higher or dropped to about −20° C. or lower, the difference in the drain-source currents may be too small for the sense amplifier to reliably sense. As a result, the semiconductor memory device may not perform a reliable read operation.

Unlike a conventional semiconductor memory device, described above, wherein, because of temperature variations and fixed data read voltage Vread, a difference between the drain-source currents Ids required for putting the transistor into the data "1" state and the data "0" state is not sufficiently large and that the likelihood of a malfunction during a read operation is high, a semiconductor memory device according to example embodiments may include a source line voltage generator or a bit line voltage generator for adaptively varying a data read voltage Vread according to a temperature variation so that the data read voltage Vread may be an intermediate value between a first drain-source voltage Vds1 for putting a transistor into a data "1" state and a second drain-source voltage Vds2 for putting the transistor into a data "0" state. Thus, it may be ensured that a sense amplifier may reliably sense a sufficiently large difference between drain-source current Ids.

Figure 4:
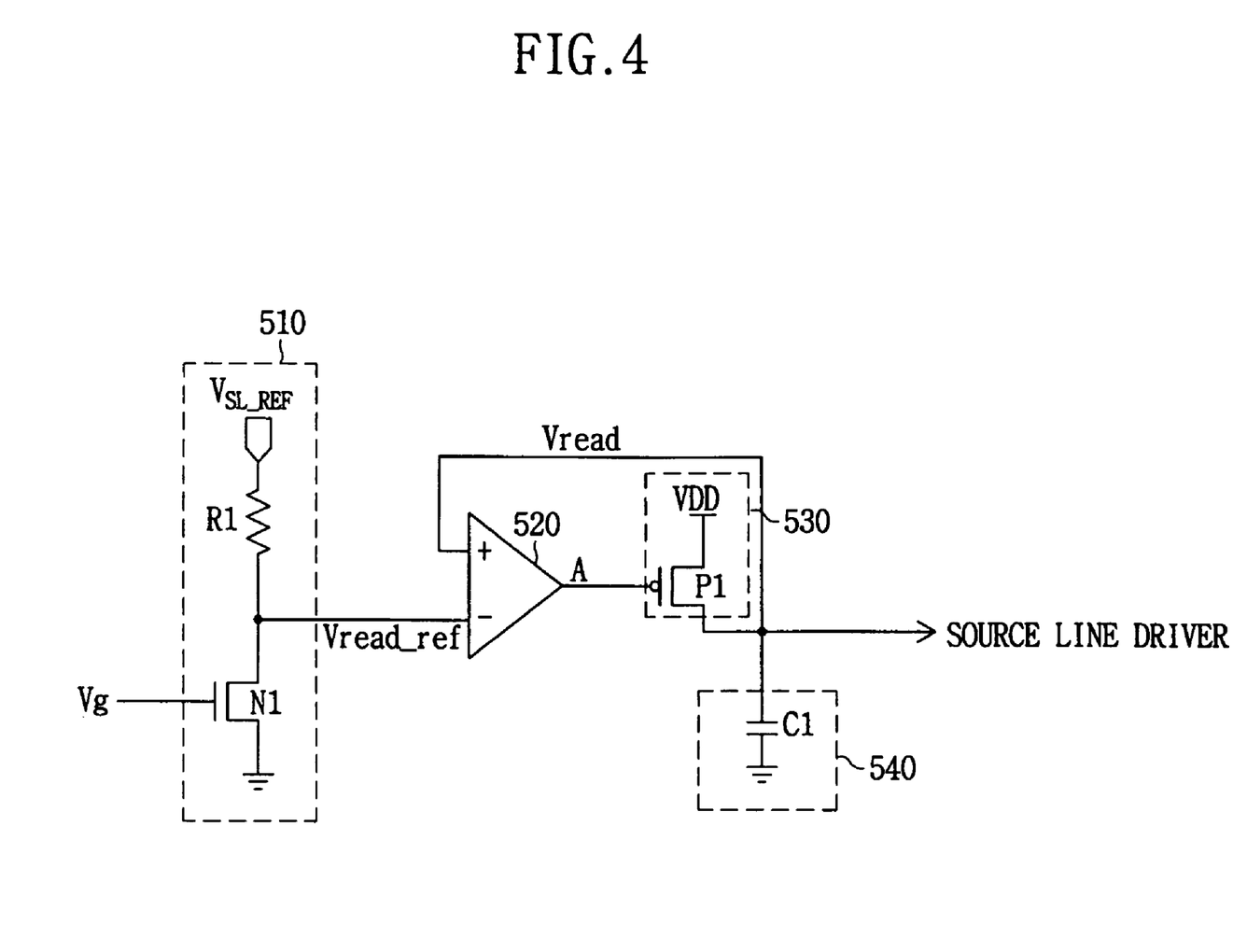
FIG. 4 is a circuit diagram of a source line voltage generator of a semiconductor memory device according to an example embodiment.

FIG. 4 is a circuit diagram of a source line voltage generator of a semiconductor memory device according to an example embodiment.

Referring to FIG. 4, the source line voltage generator may include a source line target voltage generator 510, a comparator 520, a power current supply 530 and a charge pump 540. The source line target voltage generator 510 may include a reference memory cell, for example NMOS transistor N1 connected to a first ground voltage and a resistor R1. The power current supply 530 may include a PMOS transistor P1 connected to a power supply voltage and the charge pump 540 may include a capacitor C1 connected to a second ground voltage.

Here, since the NMOS transistor N1 may be required to have similar temperature characteristic as that of a memory cell of a memory cell array, it may be produced using the same semiconductor memory fabrication process as the memory cell. However, the resistor R1 may be a PMOS transistor or an NMOS transistor.

Functions of the blocks of the source line voltage generator of the semiconductor memory device shown in FIG. 4 will now be described.

The source line target voltage generator 510 may receive a source line reference voltage VSL_REF at a drain terminal of the NMOS transistor N1 through the resistor R1, a gate voltage Vg at a gate terminal and may generate a source line target voltage Vread_ref at the drain terminal.

The comparator 520 may receive the source line target voltage Vread_ref generated by the source line target voltage generator 510 at its negative terminal and an output source line voltage Vread from a source line driver (refer to FIG. 5) at a positive terminal and may compare the source line target voltage Vread_ref with the source line output voltage Vread and may output a variable voltage signal A.

The power current supply 530 may receive a power supply voltage VDD at a source terminal of a PMOS transistor P1 and may control the amount of supply current in response to the variable voltage signal A applied to a gate terminal of the PMOS transistor P1.

When the source line output voltage Vread is lower than the source line target voltage Vread_ref the comparator 520 may output a small variable voltage signal. Accordingly, the charge pump 540 may receive a large current from the power current supply 530, charge the capacitor C1 and output a source line voltage Vread increased to a level of the source line target voltage Vread_ref.

Operation of the source line voltage generator according to example embodiments will now be described with reference to FIGS. 3A through 3C and 4.

For brevity, it is assumed that a gate voltage Vg of the reference memory cell N1 is −1V and initially source line target voltage Vread_ref is 2V at a temperature of about 25° C.

As shown in FIG. 3A, at the temperature of about 25° C., the difference between the first drain-source current Ids1 for putting the transistor into the data "0" state and the second drain-source current Ids2 for putting the transistor into the data "1" state is sufficient that the sense amplifier may reliably sense a difference in the drain-source currents Ids1 and Ids2.

That is, when an ambient temperature of the semiconductor memory device is about 25° C., the DC characteristic of the floating body transistor is maintained constant. Thus, as shown in FIG. 3A, the drain-source voltage Vds is maintained constant at a point where the drain-source current Ids rapidly rises. As a result, there is no variation in the VI curve for putting the floating body transistor into the data "1" state and the data "0" state and the floating body transistor operates with normal DC characteristics.

However, when the ambient temperature of the semiconductor memory device rises to about 85° C., the DC characteristics of the floating body transistor may change. Thus, as shown in FIG. 3B, there is a drop in the drain-source voltage Vds where the drain-source current Ids rapidly rises. As a result, the VI curve for putting the floating body transistor into the data "1" state and the data "0" state is shifted to the left.

The drain-source voltage Vds of the reference memory cell N1 of the source line target voltage generator 510 is applied to the negative terminal of the comparator 520, and the output source line voltage is applied to the positive terminal of the comparator 520.

When the source line output voltage Vread applied to the positive terminal is higher than the drain-source voltage Vds applied to the negative terminal, the comparator 520 output may increase. Accordingly, the PMOS transistor P1 of the power current supply 530 may be turned off, reducing the amount of current supplied from the power supply voltage so that the level of the output source line voltage Vread may be dropped to about 1.5V.

Similarly, when a temperature around the semiconductor memory device is dropped to about −20° C., the DC characteristic of the floating body transistor also change. Thus, as shown in FIG. 3C, the drain-source voltage Vds where the drain-source current Ids rapidly rises is further increased. As a result, the VI curves for putting the floating body transistor into the data "1" state and the data "0" state are shifted to the right.

The drain-source voltage Vds of the reference memory cell N1 of the source line target voltage generator 510 is applied to the negative terminal of the comparator 520, and the output source line voltage is applied to the positive terminal of the comparator 520.

When the output source line voltage Vread applied to the positive terminal is lower than the drain-source voltage Vds applied to the negative terminal, the comparator 520 output may decrease. Accordingly, the PMOS transistor P1 of the power current supply 530 may be turned on increasing the amount of current supplied from the power supply voltage so that the level of the output source line voltage Vread is increased to about 2.5V.

As described above, the source line voltage generator according to example embodiments may adaptively vary an output source line voltage according to a variation in ambient temperature so that the source line voltage can be an intermediate value between the first drain-source voltage Vds1 required for the data "1" state and the second drain-source voltage Vds2 required for the data "0" state. As a result, it is ensured that the sense amplifier may reliably sense a difference in the drain-source current Ids, thereby increasing the reliability of a data read operation of the semiconductor memory device.

Figure 5:
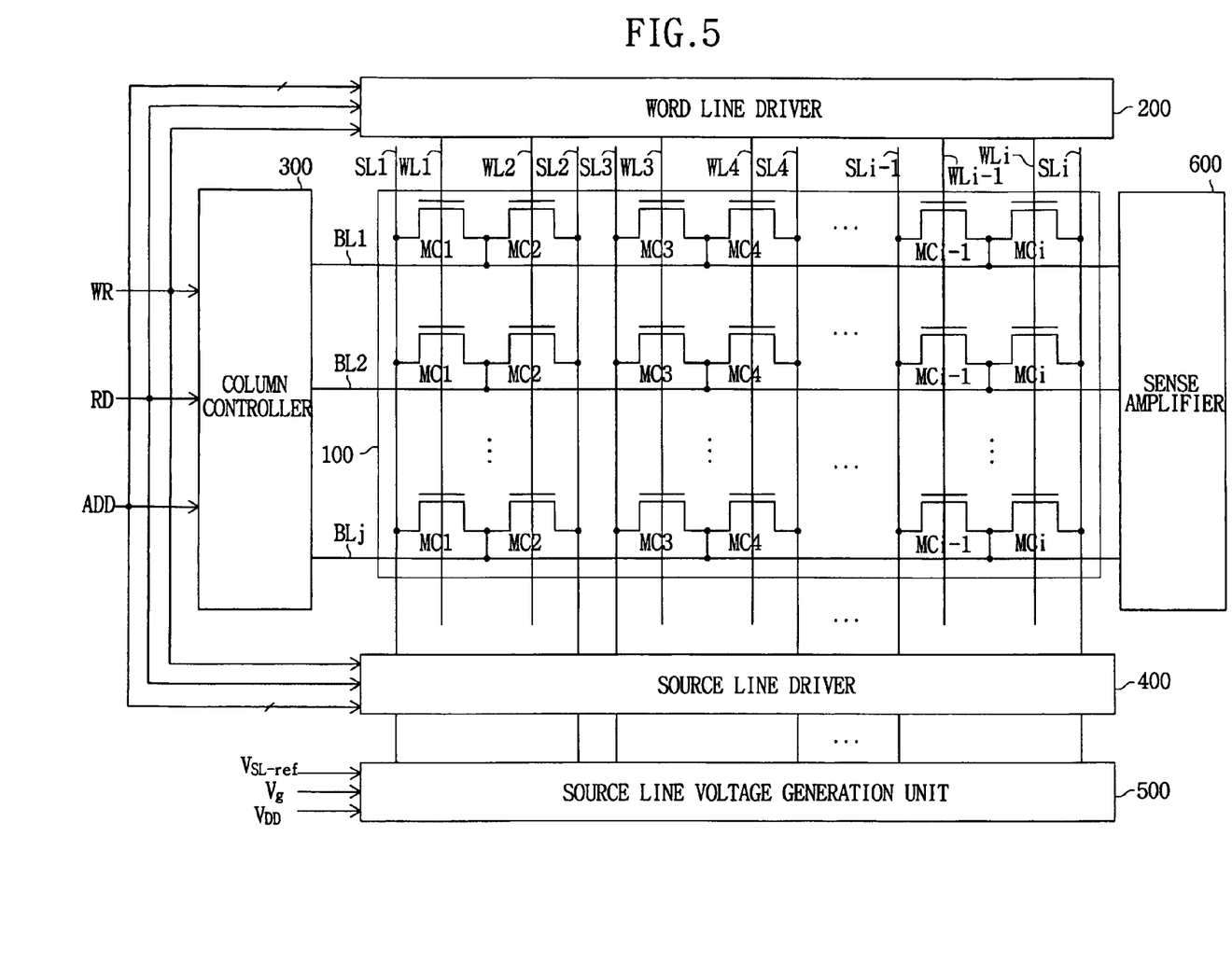
FIG. 5 is a block diagram of the semiconductor memory device including the source line voltage generator of FIG. 4.

FIG. 5 is a block diagram of the semiconductor memory device including the source line voltage generator shown in FIG. 4.

Referring to FIG. 5, the semiconductor memory device may include a memory cell array 100, a word line driver 200, a column controller 300, a source line driver 400, a source line voltage generation unit 500, and a sense amplifier 600. The memory cell array 100 may include memory cells MC1 to MCi, each of which may be respectively connected to a plurality of word lines WL1 to WLi, bit lines BL1 to BLj and source lines SL1 to SLi. Each of the memory cells MC1 to MCi may include a gate, a drain, a source, and a floating body.

Although FIG. 5 illustrates that the word lines WL1 to WLi and the source lines SL1 to SLi of the memory cell array 100 are disposed in the same direction and the bit lines BL1 to BLj are disposed in a direction perpendicular to the word lines WL1 to WLi one of ordinary skill will appreciate that the configuration is not limited thereto. The word lines WL1 to WLi may be disposed in a direction perpendicular to the source lines SL1 to SLi and the bit lines BL1 to BLj may be disposed in the same direction as the word lines WL1 to WLi.

In particular, although FIG. 5 illustrates that only the bit lines BL1 to BLj are disposed on the left of the sense amplifier 600, bit lines BLB1 to BLBj, which may be complementary to the bit lines BL1 to BLj, may be also be disposed. For example, bit lines BLB1 to BLBj may be disposed as open type on the right of the sense amplifier 600 or may be disposed as a folded type on the left of the sense amplifier 600 together with the bit lines BL1 to BLj.

The gate of each of the memory cells MC1 to MCi of the memory cell array 100 is connected to the corresponding the word lines WL1 to WLi, the source thereof is connected to the corresponding source lines SL1 to SLi, and the drains of two adjacent memory cells MC share a common node with one of the bit lines BL1 to BLj. Also, the source line voltage generation unit 500 may include a plurality of source line voltage generators.

Although FIG. 5 illustrates that the source line driver 400 and the source line voltage generation unit 500 are disposed on the opposite side of the word line driver 200, the source line driver 400 and the source line voltage generation unit 500 may be disposed on the same side of the word line driver 200. Also, unlike as in FIG. 4, in each source line voltage generator of the source line voltage generation unit 500, the comparator 520, the power current supply 530, and the charge pump 540 may be disjoined from the source line target voltage generator 510 and disposed in the sense amplifier 600.

Functions of the blocks of the semiconductor memory device shown in FIG. 5 will now be described.

The memory cell array 100 may allow or prevent the flow of a bipolar current Ids through memory cells selected by the plurality of word lines WL1 to WLi, source lines SL1 to SLi, and the bit lines BL1 to BLj, thereby writing or reading data "1" or data "0".

The column controller 300 may control the bit lines BL1 to BLj in response to a write signal WR or a read signal RD and an address signal ADD, thereby preventing data from being written to or read from unselected memory cells and writing/reading data "1" or data "0" to/from the selected memory cells.

The word line driver 200 may control the word lines WL1 to WLi in response to the write signal WR or the read signal RD and the address signal ADD and may accordingly select memory cells.

The source line driver 400 may control the source lines SL1 to SLi in response to the write signal WR or the read signal RD and the address signal ADD and may accordingly select memory cells.

The source line voltage generation unit 500 may generate the source line target voltage, compare the source line target voltage with the source line output voltage, and vary the source line output voltage according to a temperature.

The sense amplifier 600 may sense a difference in the bipolar current Ids flowing through bit lines in response to data read from the selected memory cells and may amplify the difference to a level having a high output driving capability.

Write and read operations of the semiconductor memory device shown in FIG. 5 will now be described.

Operations of writing and reading data "1" and data "0" using the accumulation of majority carriers (holes, for example) in a floating body of an NMOS transistor constituting the memory cell MC and the flow of the bipolar current Ids are the same as the write and read operations of the conventional semiconductor memory device described with reference to FIG 2 and therefore, a further detailed description thereof is omitted.

The sense amplifier 600 according to the present example embodiment may receive current flowing through bit lines and complementary bit line (for example, BLB1 to BLBj) in response to data written to or read from the selected memory cells, sense a difference in the bipolar current Ids, and determine if majority carriers are accumulated in the floating body of the NMOS transistor.

In this case, when a temperature around the semiconductor memory device is greatly changed, the source line voltage generators of the source line voltage generation unit 500 may adaptively vary respective source line target voltages so that each of the source line target voltages may be an intermediate value between a drain-source voltage Vds1 required for a data "1" state and a drain-source voltage Vds2 required for a data "0" state.

Thus, the sense amplifier 600 may reliably sense a difference between a drain-source current required for the data "1" state and a drain-source current required for the data "0" state in response to data written to the selected memory cells to make a data read operation reliable, may amplify the current difference to a level having a high output driving capability and may output the amplified current.

Figure 6:
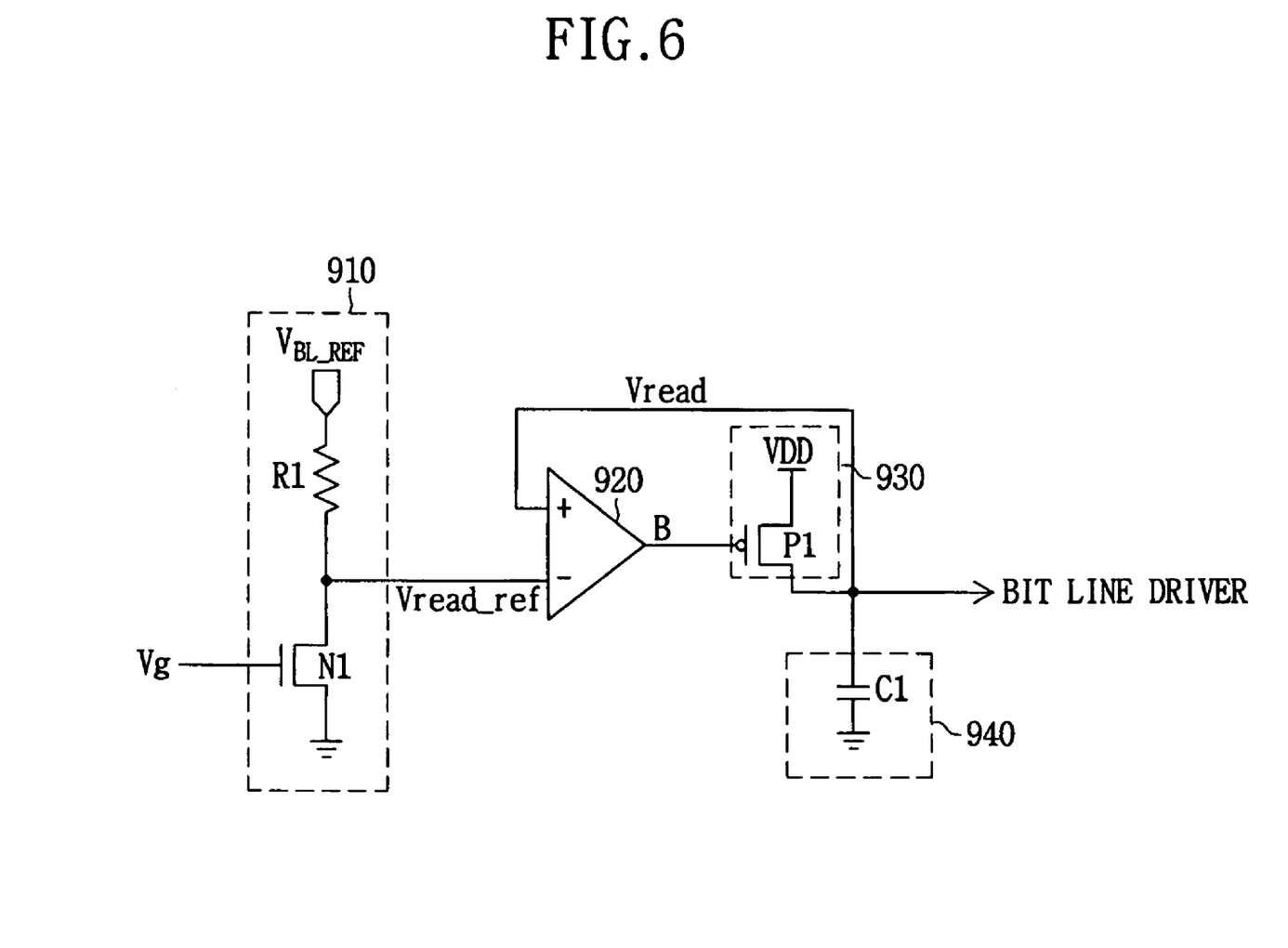
FIG. 6 is a circuit diagram of a bit line voltage generator of a semiconductor memory device according to another example embodiment.

FIG. 6 is a circuit diagram of a bit line voltage generator of a semiconductor memory device according to another example embodiment.

Referring to FIG. 6, the bit line voltage generation unit may include a bit line target voltage generator 910, a comparator 920, a power current supply 930, and a charge pump 940. The bit line target voltage generator 910, the power current supply 930, and the charge pump 940 are somewhat similar in design respectively to the source line target voltage generator 510, the power current supply 530, and the charge pump 540 of the source line voltage generation unit 500 of the semiconductor memory device shown in FIG. 4.

Similarly, since a reference memory cell N1, for example, an NMOS transistor, may be required to have similar temperature characteristics as a memory cell of a memory cell array, it may be produced using the same semiconductor memory fabrication process as the memory cell. However, as put forth earlier, a resistor R1 may be a PMOS transistor or an NMOS transistor.

Functions of the blocks of the bit line voltage generator of the semiconductor memory device shown in FIG. 6 will now be described.

The bit line target voltage generator 910 may receive a bit line reference voltage VBL_REF at a drain terminal of the NMOS transistor N1 through the resistor R1, a gate voltage at a gate terminal and may generate a bit line target voltage Vread_ref at the drain.

The comparator 920 may receive the bit line target voltage Vread_ref generated by the bit line target voltage generator 910 at a negative terminal and an output bit line voltage Vread from a bit line driver (refer to FIG. 6) at a positive terminal, compare the bit line target voltage Vread_ref with the bit line output voltage Vread and output a variable voltage signal B.

The power current supply 930 may receive a power supply voltage VDD at a source terminal of a PMOS transistor P1 and may control the amount of supply current in response to the variable voltage signal B applied to a gate terminal of the PMOS transistor P1.

When the bit line output voltage Vread is lower than the bit line target voltage Vread_ref, the comparator 920 may output a small variable voltage signal and the charge pump 940 may accordingly receive a large current from the power current supply 930. The charge pump 940 may charge the capacitor C1 and increase the bit line output voltage Vread to a bit line target voltage level.

Operation of the bit line voltage generator of the semiconductor memory device according to another example embodiment will now be described with reference to FIGS. 3A through 3C and 6.

For brevity, it may be assumed that a gate voltage Vg of the reference memory cell N1 is −1V and initially bit line target voltage is 2V at a temperature of about 25° C.

As shown in FIG. 3A, at the temperature of about 25° C., a drain-source voltage Vds where a drain-source current Ids rapidly rises is maintained constant. As a result, there is no variation in a VI curve for putting a floating body transistor into a data "1" state and a data "0" state and the floating body transistor operates with normal DC characteristics. However, when an ambient temperature of the semiconductor memory device is raised to about 85° C., the DC characteristic of the floating body transistor may be changed. Thus, as shown in FIG. 3B, the VI curve for putting the floating body transistor into the data "1" state and the data "0" state is generally shifted to the left.

Therefore, the drain-source voltage Vds of the reference memory cell N1 of the bit line target voltage generator 910 may become lower less than the initial bit line target voltage and may be applied to the negative terminal of the comparator 920, and the output bit line voltage is applied to the positive terminal of the comparator 920.

As a result the comparator 920 may increase the output voltage. In this case, the PMOS transistor P1 of the power current supply 930 is turned off to reduce the amount of current supplied from the power supply voltage so that the level of the output bit line voltage may be dropped to 1.5V.

Conversely, when the ambient temperature of the semiconductor memory device is dropped to about −20° C., the DC characteristic of the floating body transistor may also change. Thus, as shown in FIG. 3C, the VI curve for putting the floating body transistor into the data "1" state and the data "0" state is generally shifted to the right.

Therefore, the drain-source voltage Vds of the reference memory cell N1 of the bit line target voltage generator 910 may become higher than the initial bit line target voltage and may be applied to the negative terminal of the comparator 920, and the output bit line target voltage may be applied to the positive terminal of the comparator 920.

As a result, the comparator 920 may drop the level of its output voltage. In this case, the PMOS transistor P1 of the power current supply 930 is turned on increasing the amount of current supplied from the power supply voltage and the level of the output bit line target voltage may be increased to about 2.5V.

As described above, the bit line voltage generator according to another example embodiment may adaptively vary an output bit line voltage according to an ambient temperature so that the output bit line voltage may be an intermediate value between a drain-source voltage Vds1 required for the data "1" state and a second drain-source voltage Vds2 required for the data "0" state. As a result, a sufficient difference in the drain-source current Ids may be ensured and reliably sensed by a sense amplifier, thereby increasing the reliability of a data read operation of the semiconductor memory device.

Figure 7:
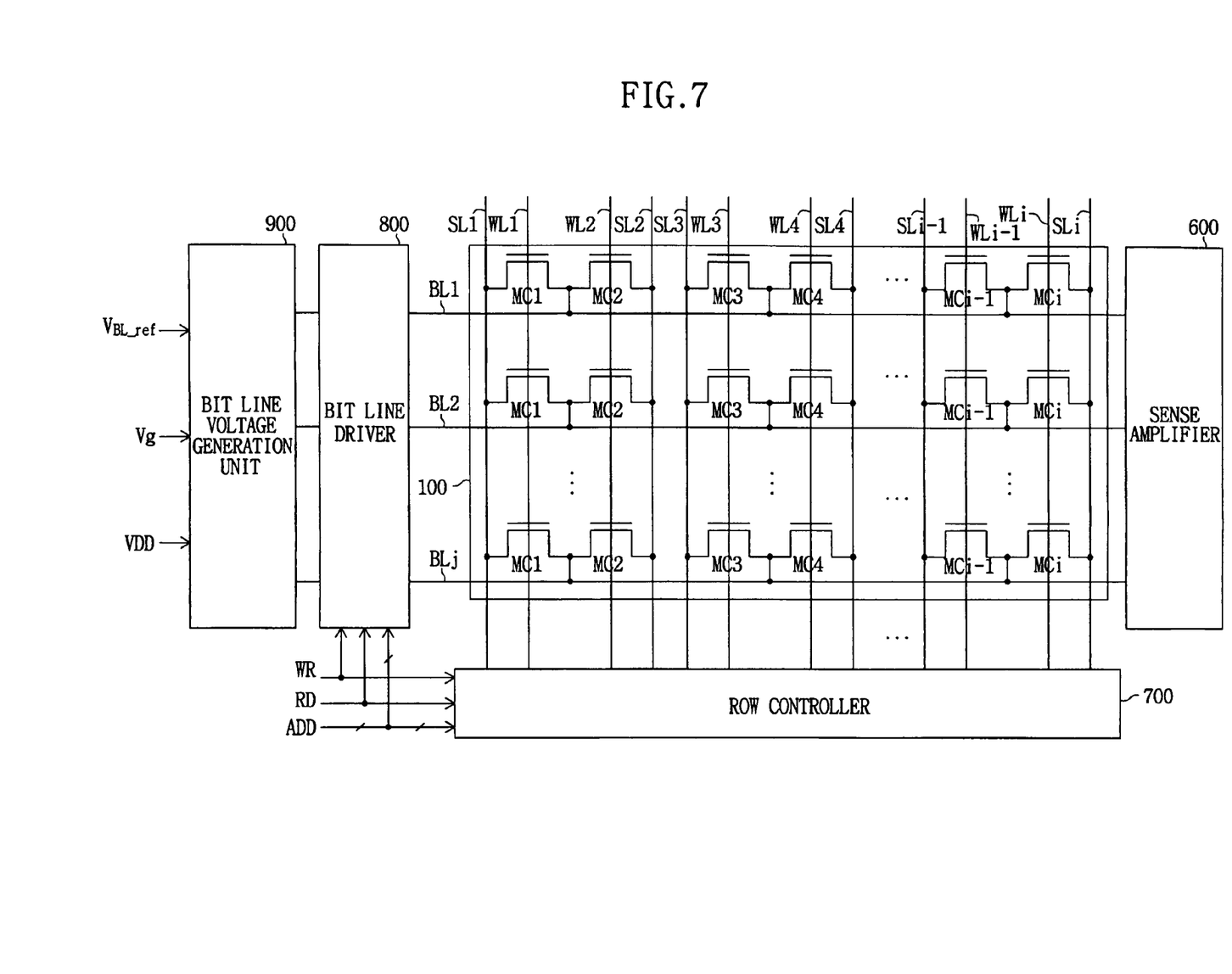
FIG. 7 is a block diagram of the semiconductor memory device including the bit line voltage generator of FIG. 6.

FIG. 7 is a block diagram of the semiconductor memory device including the bit line voltage generator shown in FIG. 6.

Referring to FIG. 7, the semiconductor memory device may include a memory cell array 100, a row controller 700, a bit line driver 800, a bit line voltage generation unit 900, and a sense amplifier 600. The memory cell array 100 may include memory cells MC1 to MCi, which may be connected to word lines WL1 to WLi, bit lines BL1 to BLj, and source lines SL1 to SLi. Each of the memory cells MC1 to MCi may include a gate, a drain, a source, and a floating body.

Similarly, although FIG. 7 illustrates that the word lines WL1 to WLi and the source lines SL1 to SLi of the memory cell array 100 are disposed in the same direction and the bit lines BL1 to BLj are disposed in a perpendicular direction to the word lines WL1 to WLi, the word lines WL1 to WLi may be disposed in a perpendicular direction to the source lines SL1 to SLi, and the bit lines BL1 to BLj may be disposed in the same direction as the word lines WL1 to WLi.

The gate of each of the memory cells MC1 to MCi of the memory cell array 100 is connected to corresponding word line WL1 to WLi, the source thereof is connected to the corresponding source line SL1 to SLi, and the drains of two adjacent memory cells MC share a connection with the corresponding bit line BL1 to BLj. For example, as illustrated in FIG. 7 drains of memory cells MC1 and MC2 share a connection with bit line BL1. Also, the bit line voltage generation unit 900 may include a plurality of bit line voltage generators.

Similarly, unlike as in FIG. 6, in each of the bit line voltage generators of the bit line voltage generation unit 900, the comparator 920, the power current supply 930, and the charge pump 940 may be disjoined from the bit line target voltage generator 910 and disposed in the sense amplifier 600.

Functions of the blocks of the semiconductor memory device shown in FIG. 7 will now be described.

The memory cell array 100 may allow or prevent the flow of a bipolar current Ids through memory cells selected by the plurality of word lines WL1 to WLi, source lines SL1 to SLi, and the bit lines BL1 to BLj, thereby writing or reading data "1" or data "0".

The row controller 700 may control the word lines WL1 to WLi and the source lines SL1 to SLi in response to a write signal WR or a read signal RD and an address signal ADD to select memory cells, thereby preventing data from being written to or read from unselected memory cells and writing/reading data "1" or data "0" to/from the selected memory cells.

The bit line driver 800 may control the bit lines BL1 to BLj in response to the write signal WR or the read signal RD and the address signal ADD and may accordingly select memory cells.

The bit line voltage generation unit 900 may generate the bit line target voltage, compare the bit line target voltage with the bit line output voltage and vary the bit line output voltage according to a temperature.

The sense amplifier 600 may sense a difference in the bipolar current Ids flowing through bit lines in response to data read from the selected memory cells and may amplify the difference to a level having a high output driving capability.

Write and read operations of the semiconductor memory device shown in FIG. 7 will now be described.

Operations of writing and reading data "1" and data "0" using the accumulation of majority carriers (holes, for example) in a floating body of an NMOS transistor constituting the memory cell MC and the flow of the bipolar current Ids are somewhat similar to the write and read operations of the conventional semiconductor memory device described with reference to FIG. 5 and thus, a further detailed description thereof is omitted for the sake of brevity.

However, when an ambient temperature of the semiconductor memory device is greatly changed, the bit line voltage generators of the bit line voltage generation unit 900 adaptively vary respective bit line target voltages so that each of the bit line target voltages can be an intermediate value between a drain-source voltage Vds1 required for a data "1" state and a drain-source voltage Vds2 required for a data "0" state.

Thus, the sense amplifier 600 may reliably sense a difference between a drain-source current required for the data "1" state and a drain-source current required for the data "0" state in response to data written to the selected memory cells to ensure a reliable data read operation, amplify the current difference to a level having high output driving capability and output the amplified current.

In the previous example embodiments, a data read operation may simultaneously be performed on memory cells connected to at least two source lines (or at least one bit line) or all source lines (or all bit lines) of a memory cell array. However, when a memory cell array includes a plurality of memory cell array banks, it may also be possible that a data read operation may be simultaneously performed on memory cells connected to all source lines (or all bit lines) of the memory cell array bank, and aforementioned temperatures and voltage levels may be replaced by different temperatures and voltage levels within predetermined ranges.

A semiconductor memory device according to example embodiments may adaptively vary a source line voltage or a bit line voltage according to an ambient temperature such that a floating body transistor using operation of a bipolar junction transistor can operate properly irrespective of a temperature variation, thereby making a data read operation reliable and improving an operating speed and a data retention characteristic due to a rise in a driving current.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor memory device comprising:
a memory cell array including a plurality of memory cells connected to a plurality of word lines, a plurality of source lines, and a plurality of bit lines, each memory cell having a transistor with a floating body;
a source line driver configured to control at least one of the plurality of source lines to select at least one memory cell of the plurality of memory cells in response to an address signal;
a source line voltage generation unit configured to receive a source line reference voltage to generate a source line target voltage, receive an source line output voltage from the source line driver, compare the level of the source line output voltage with the level of the source line target voltage, adaptively vary the source line output voltage according to a temperature, and supply the source line output voltage to the at least one source line; and
a sense amplifier configured to sense a difference in current flowing through the plurality of bit lines in response to data read from the selected at least one memory cell, amplify the difference to a level having high output driving capability and output the amplified current.

2. The semiconductor memory device according to claim 1, further comprising:
a column controller configured to control the plurality of bit lines to select the at least one memory cell in response to a write signal or a read signal and the address signal; and
a word line driver configured to control the plurality of word lines to select the at least one memory cell in response to the write signal or the read signal and the address signal.

3. The semiconductor memory device according to claim 2, wherein the memory cell array controls the flow of a bipolar current through the at least one memory cell selected by one of the plurality of word lines, source lines, and the bit lines to write or read data "1" or data "0".

4. The semiconductor memory device according to claim 3, wherein the column controller controls the plurality of bit lines in response to the write signal or the read signal and the address signal to prevent data from being written to or read from unselected memory cells and to write/read the data "1" or the data "0" to/from the selected memory cells.

5. The semiconductor memory device according to claim 4, wherein the source line voltage generation unit includes a plurality of source line voltage generators, each of the source line voltage generators adaptively varying the source line output voltage to generate an source line output voltage that is intermediate between a drain-source voltage for putting the transistor into a data "1" state and a drain-source voltage for putting the transistor into a data "0" state when an ambient temperature of the semiconductor memory device is changed.

6. The semiconductor memory device according to claim 5, wherein each of the plurality of source line voltage generators includes:
a source line target voltage generator configured to receive the source line reference voltage and a gate voltage and generate the source line target voltage;
a comparator configured to receive the source line target voltage and the source line output voltage, compare the source line target voltage with the source line output voltage, and output a variable voltage signal;
a power current supply configured to receive a power supply voltage, control the amount of supply current in response to the variable voltage signal and output the controlled supply current; and
a charge pump configured to receive the supply current from the power current supply, increase the source line output voltage to a level of the source line target voltage when the source line output voltage is at a level lower than the generated source line target voltage and supply the increased source line output voltage to the source line driver and the comparator.

7. The semiconductor memory device according to claim 6, wherein the source line target voltage generator includes:
a resistor having a first terminal supplied with the source line reference voltage; and
a reference memory cell having a drain terminal connected to a second terminal of the resistor and supplied with the source line reference voltage, a grounded source terminal and a gate terminal to which the gate voltage is applied, the reference memory cell generating the source line target voltage at the drain terminal.

8. The semiconductor memory device according to claim 7, wherein the resistor includes at least one of a PMOS transistor and an NMOS transistor.

9. The semiconductor memory device according to claim 8, wherein the reference memory cell and the at least one memory cell of the memory cell array are produced using the same semiconductor memory fabrication process, the reference memory cell having substantially similar temperature characteristics as the at least one memory cell.

10. The semiconductor memory device according to claim 9, wherein
the comparator receives the generated source line target voltage at a negative terminal, receives a fed back source line output voltage at a positive terminal, compares the source line target voltage with the source line output voltage and outputs a variable voltage signal, wherein
the voltage level of the variable voltage signal is decreased when the source line target voltage is higher than the source line output voltage and is increased when the source line target voltage is lower than the source output line voltage.

11. The semiconductor memory device according to claim 10, wherein the power current supply includes a PMOS transistor, which receives the power supply voltage at a source terminal and the variable voltage signal at a gate terminal, and is turned on when a decreased variable voltage signal is received, supplying an increased amount of supply current and is turned off when an increased variable voltage signal is received, supplying a reduced amount of supply current.

12. The semiconductor memory device according to claim 11, wherein the charge pump includes a grounded capacitor receiving an increased amount of supply current when the generated source line target voltage is higher than the source line output voltage, thereby increasing the source line output voltage to the level of the source line target voltage.

13. The semiconductor memory device according to claim 12, wherein the sense amplifier senses a difference between a drain-source current for putting the transistor into the data "1" state and a drain-source current for putting the transistor into the data "0" state in response to data written to the selected at least one memory cell, amplifies the difference to a level having high output driving capability and outputs the amplified current.

14. A semiconductor memory device comprising:
   a memory cell array including a plurality of memory cells connected to a plurality of word lines, source lines, and bit lines, each memory cell having a transistor with a floating body;
   a bit line driver configured to control the plurality of bit lines to select at least one memory cell of the plurality of memory cells in response to an address signal;
   a bit line voltage generation unit configured to receive a bit line reference voltage to generate a bit line target voltage, receive a bit line output voltage from the bit line driver, compare the level of the bit line output voltage with the level of the bit line target voltage, adaptively vary the bit line output voltage according to the temperature and supply the bit line output voltage to the plurality of bit lines; and
   a sense amplifier configured to sense a difference in current flowing through the plurality of bit lines in response to data read from the selected at least one memory cell, amplify the difference to a level having high output driving capability and output the amplified current.

15. The semiconductor memory device according to claim 14, further comprising:
   a row controller configured to control the plurality of word lines and the source lines to select the at least one memory cell in response to a write signal or a read signal and the address signal.

16. The semiconductor memory device according to claim 15, wherein the memory cell array controls the flow of a bipolar current through the at least one memory cell selected by at least one of the plurality of word lines, source lines, and the bit lines to write or read data "1" or data "0".

17. The semiconductor memory device according to claim 16, wherein the bit line voltage generation unit includes a plurality of bit line voltage generators, each of the bit line voltage generators adaptively varying the bit line output voltage to generate a bit line output voltage that is an intermediate between a drain-source voltage for putting the transistor into a data "1" state and a drain-source voltage for putting the transistor into a data "0" state when an ambient temperature of the semiconductor memory device is changed.

18. The device according to claim 17, wherein each of the plurality of bit line voltage generators includes:
   a bit line target voltage generator configured to receive the bit line reference voltage and a gate voltage and generate the bit line target voltage;
   a comparator configured to receive the bit line target voltage and the bit line output voltage, compare the bit line target voltage with the bit line output voltage and output a variable voltage signal;
   a power current supply configured to receive a power supply voltage, control the amount of supply current in response to the variable voltage signal, and output the controlled supply current; and
   a charge pump configured to receive the supply current from the power current supply, increase the bit line output voltage to a level of the bit line target voltage when the bit line output voltage is at a level lower than the generated bit line target voltage and supply the increased bit line output voltage to the bit line driver and the comparator.

19. The device according to claim 18, wherein the bit line target voltage generator includes:
   a resistor having a first terminal supplied with the bit line reference voltage; and
   a reference memory cell having a drain terminal connected to a second terminal of the resistor and supplied with the bit line reference voltage, a grounded source terminal and a gate terminal to which the gate voltage is applied, the reference memory cell generating the bit line target voltage at the drain terminal.

20. The semiconductor memory device according to claim 19, wherein the resistor includes at least one of a PMOS transistor and an NMOS transistor.

21. The semiconductor memory device according to claim 20, wherein the reference memory cell and the at least one memory cell of the memory cell array are produced using the same semiconductor memory fabrication process, the reference memory cell having substantially similar temperature characteristics as the at least one memory cell.

22. The semiconductor memory device according to claim 21, wherein
   the comparator receives the generated bit line target voltage at a negative terminal, receives a fed back bit line output voltage at a positive terminal, compares the bit line target voltage with the bit line output voltage and outputs a variable voltage signal, wherein
   the voltage level of the variable voltage signal is decreased when the bit line target voltage is higher than the bit line output voltage and is increased when the bit line target voltage is lower that the bit line output voltage.

23. The semiconductor memory device according to claim 22, wherein the power current supply includes a PMOS transistor, which receives the power supply voltage at a source terminal and the variable voltage signal at a gate terminal, and is turned on when a decreased variable voltage signal is received, supplying an increased amount of supply current and is turned off when an increased variable voltage is received, supplying a reduced amount of supply current.

24. The semiconductor memory device according to claim 23, wherein the charge pump includes a grounded capacitor receiving an increased amount of supply current when the generated bit line target voltage is higher than the bit line output voltage, thereby increasing the bit line output voltage to the level of the bit line target voltage.

25. The semiconductor memory device according to claim 24, wherein the sense amplifier senses a difference between a drain-source current for putting the transistor into the data "1" state and a drain-source current for putting the transistor into the data "0" state in response to data written to the selected at least memory cell, amplifies the difference to a level having high output driving capability and outputs the amplified current.

* * * * *